United States Patent
Chou et al.

(10) Patent No.: US 8,031,444 B2
(45) Date of Patent: Oct. 4, 2011

(54) MAGNETORESISTIVE DEVICE OF THE CPP TYPE, AND MAGNETIC DISK SYSTEM

(75) Inventors: Tsutomu Chou, Tokyo (JP); Tomohito Mizuno, Tokyo (JP); Koji Shimazawa, Tokyo (JP); Yoshihiro Tsuchiya, Tokyo (JP); Shinji Hara, Tokyo (JP); Hironobu Matsuzawa, Tokyo (JP)

(73) Assignee: TDK Corporation, Tokyo (JP)

( * ) Notice: Subject to any disclaimer, the term of this patent is extended or adjusted under 35 U.S.C. 154(b) by 493 days.

(21) Appl. No.: 12/255,105

(22) Filed: Oct. 21, 2008

(65) Prior Publication Data
US 2010/0097722 A1 Apr. 22, 2010

(51) Int. Cl.
*G11B 5/33* (2006.01)
(52) U.S. Cl. ............... 360/324.1; 360/324; 360/324.11; 360/324.12
(58) Field of Classification Search .......... 360/324, 360/324.1–324.2, 324.11–324.12, 245, 246.1, 360/313; 365/171, 173, 158
See application file for complete search history.

(56) References Cited

U.S. PATENT DOCUMENTS
7,948,717 B2 * 5/2011 Yuasa et al. ............... 360/324
2008/0170336 A1 7/2008 Tsuchiya et al.

FOREIGN PATENT DOCUMENTS
| JP | 2003-8102 | 1/2003 |
| JP | 2004-193240 | 7/2004 |
| JP | 2008-177271 | 7/2008 |

* cited by examiner

*Primary Examiner* — David Lam
(74) *Attorney, Agent, or Firm* — Oblon, Spivak, McClelland, Maier & Neustadt, L.L.P.

(57) ABSTRACT

The semiconductor oxide layer that forms a part of the spacer layer in the inventive giant magnetoresistive device (CPP-GMR device) is composed of zinc oxide of wurtzite structure that is doped with a dopant given by at least one metal element selected from the group consisting of Zn, Ge, V, and Cr in a content of 0.05 to 0.90 at %: there is the advantage obtained that ever higher MR ratios are achievable while holding back an increase in the area resistivity AR.

12 Claims, 5 Drawing Sheets

MAGNETORESISTIVE DEVICE OF THE CPP TYPE, AND MAGNETIC DISK SYSTEM

BACKGROUND OF THE INVENTION

1. Field of the Invention

The present invention relates to a magnetoresistive device adapted to read the magnetic field intensity of magnetic recording media or the like as signals, and a thin-film magnetic head comprising that magnetoresistive device as well as a head gimbal assembly and a magnetic disk system, one each including that thin-film magnetic head.

2. Explanation of the Prior Art

In recent years, with an increase in the longitudinal recording density of magnetic disk systems, there have been growing demands for improvements in the performance of thin-film magnetic heads. For the thin-film magnetic head, a composite type thin-film magnetic head has been widely used, which has a structure wherein a reproducing head having a read-only magnetoresistive device (hereinafter often called the MR device for short) and a recording head having a write-only induction type magnetic device are stacked together.

The MR device, for instance, includes an AMR device making use of the anisotropic magnetoresistive effect, a GMR device harnessing the giant magnetoresistive effect, and a TMR device tapping the tunnel-type magnetoresistive effect.

The reproducing head must have some characteristics in general, and high sensitivity and high output in particular. For the reproducing head capable of meeting such demands, there has already been a GMR head mass produced that makes use of a spin valve type of GRM device.

Such a spin valve type GMR device generally comprises, as part of the device, a nonmagnetic layer, a first magnetic layer (the so-called free layer) formed on one surface of the nonmagnetic layer, a second magnetic layer (fixed magnetization layer) formed on another surface of the nonmagnetic layer, and a pinning layer (generally an antiferromagnetic layer) formed in contact with the fixed magnetization layer that faces away from the nonmagnetic layer. The free layer operates such that the direction of magnetization changes in response to a signal magnetic filed coming from outside, and the fixed magnetization layer has the direction of magnetization fixed by an exchange coupling magnetic field from the pinning layer (antiferromagnetic layer). With such device structure, MR changes are achievable via a difference in the relative angle of spins in two such ferromagnetic layers.

As head size diminishes, there is a mounting demand for an arrangement capable of increasing the MR ratio, and the so-called current narrowing type head has been proposed as one of the prior arts capable of obtaining large MR ratios while resistance is kept low (see JP(A)2005-243154 (JP Patent No. 3993175)). However, that head structure is not compatible with a demand for drastic decreases in the head area: much difficulty is encountered in achieving sufficient size reductions, with high precision, of a Cu-pillar located in a spacer and used for narrowing currents. For this reason, it is difficult to hold back characteristics variations for each device, and much is still desired for the reliability of the device itself, offering an obstacle to practical use.

JP(A)2003-8102 that is another prior art discloses a CPP-GMR device that comprises a fixed magnetization layer including a magnetic film having the direction of magnetization substantially fixed in one direction, a free magnetization layer including a magnetic film having the direction of magnetization changing in response to an external magnetic field, a nonmagnetic metal intermediate layer interposed between the fixed magnetization layer and the free magnetization layer, and a resistance adjustment layer interposed between the fixed magnetization layer and the free magnetization layer and formed of a material having up to $10^{22}/cm^3$ of conduction carriers. According to this proposal, the problem with characteristics variations for each device is eased off because of no use of any Cu-pillar for the formation of the narrowing structure. In addition, adjustment of device resistance enables a proper area resistivity to be achieved. However, the effect on improvements in the MR ratio is limited because the MR ratio depends largely on the nature of the nonmagnetic metal intermediate layer.

To solve such a problem with JP(A)2003-8102, the inventors have already filed JP(A)2008-177272 to propose a CPP-GMR device wherein 1 to 8 at % of a given metal are contained in a semiconductor oxide layer forming a part of the spacer layer.

According to this proposal, the addition of the given metal in an amount of at least 1 at % has the features of maintaining ohmic conduction and reducing shot noises, and the proper area resistivity is achieved, too. However, there is no end to the demand for MR ratio improvements: much more improvements are still now in great demand.

The situations being like this, the present invention has been made for the purpose of providing a novel magnetoresistive device that is just only capable of overcoming the aforesaid problems with the prior art but also can make the MR ratio high while holding back an increase in the area resistivity, and a thin-film magnetic head comprising that magnetoresistive device as well as a head gimbal assembly and a magnetic disk system, one each comprising that thin-film magnetic head.

SUMMARY OF THE INVENTION

According to the present invention, the aforesaid object is accomplished by the provision of a giant magnetoresistive device (CPP-GMR device) of a CPP (current perpendicular to plane) structure, comprising a spacer layer, and two ferromagnetic layers stacked together and formed while said spacer layer is sandwiched between them, with a sense current applied in the stacking direction, wherein said two ferromagnetic layers function such that the angle made between the directions of mutual magnetizations changes relatively in response to an external magnetic field, said spacer layer comprises first and second nonmagnetic metal layers, one each formed of a nonmagnetic metal material, and a semiconductor oxide layer interposed between the first and second nonmagnetic metal layers, said semiconductor oxide layer forming a part of said spacer layer is zinc oxide of wurtzite structure, and said zinc oxide is doped with a dopant comprising at least one metal element selected from the group consisting of zinc or Zn, germanium or Ge, vanadium or V, and chromium or Cr in a content of 0.05 to 0.90 at %.

In a preferable embodiment of the inventive magneto-resistive device, the metal element with which said zinc oxide is doped is Zn.

In a preferable embodiment of the inventive magneto-resistive device, said first nonmagnetic metal layer comprises copper or Cu, and said second nonmagnetic metal layer substantially comprises Zn.

In a preferable embodiment of the inventive magneto-resistive device, the semiconductor oxide layer forming a part of said spacer layer has a thickness of 1.0 to 2.5 nm.

In a preferable embodiment of the inventive magneto-resistive device, said first and second nonmagnetic metal layers each have a thickness of 0.3 to 2.0 nm.

In a preferable embodiment of the inventive magneto-resistive device, said two ferromagnetic layers are constructed, one as a fixed magnetization layer having a fixed direction of magnetization, and another as a free layer functioning such that the direction of magnetization changes in response to an external magnetic field.

In a preferable embodiment of the inventive magneto-resistive device, said spacer layer is located such that said first nonmagnetic metal layer is in contact with said fixed magnetization layer, and said second nonmagnetic metal layer is in contact with said free layer.

In a preferable embodiment of the inventive magneto-resistive device, said two ferromagnetic layers are free layers that operate such that the relative angle between the magnetizations of both layers changes in response to an external magnetic field.

In a preferable embodiment of the inventive magneto-resistive device, the semiconductor oxide layer forming a part of said spacer layer comprises zinc oxide of wurtzite structure that is doped with Zn that acts as the dopant in a content of 0.05 to 0.90 at %, and the magnetoresistive device has an area resistivity of 0.1 to 0.5 $\Omega \cdot \mu m^2$.

The invention also provides a thin-film magnetic head, comprising a plane in opposition to a recording medium, the aforesaid magnetoresistive device that is located near said medium opposite plane to detect a signal magnetic field from said recording medium, and a pair of electrodes for passing a current in the stacking direction of the aforesaid magnetoresistive device.

Further, the invention provides a head gimbal assembly, comprising a slider including the aforesaid thin-film magnetic head and located in such a way as to oppose to a recording medium, and a suspension adapted to resiliently support said slider.

Yet Further, the invention provides a magnetic disk system, comprising a slider including the aforesaid thin-film magnetic head and located in such a way as to oppose to a recording medium, and a positioning device adapted to support and position said slider with respect to said recording medium.

EXPLANATION OF THE PREFERRED EMBODIMENTS

The best mode for carrying out the invention is now explained in greater details.

Figure 1:
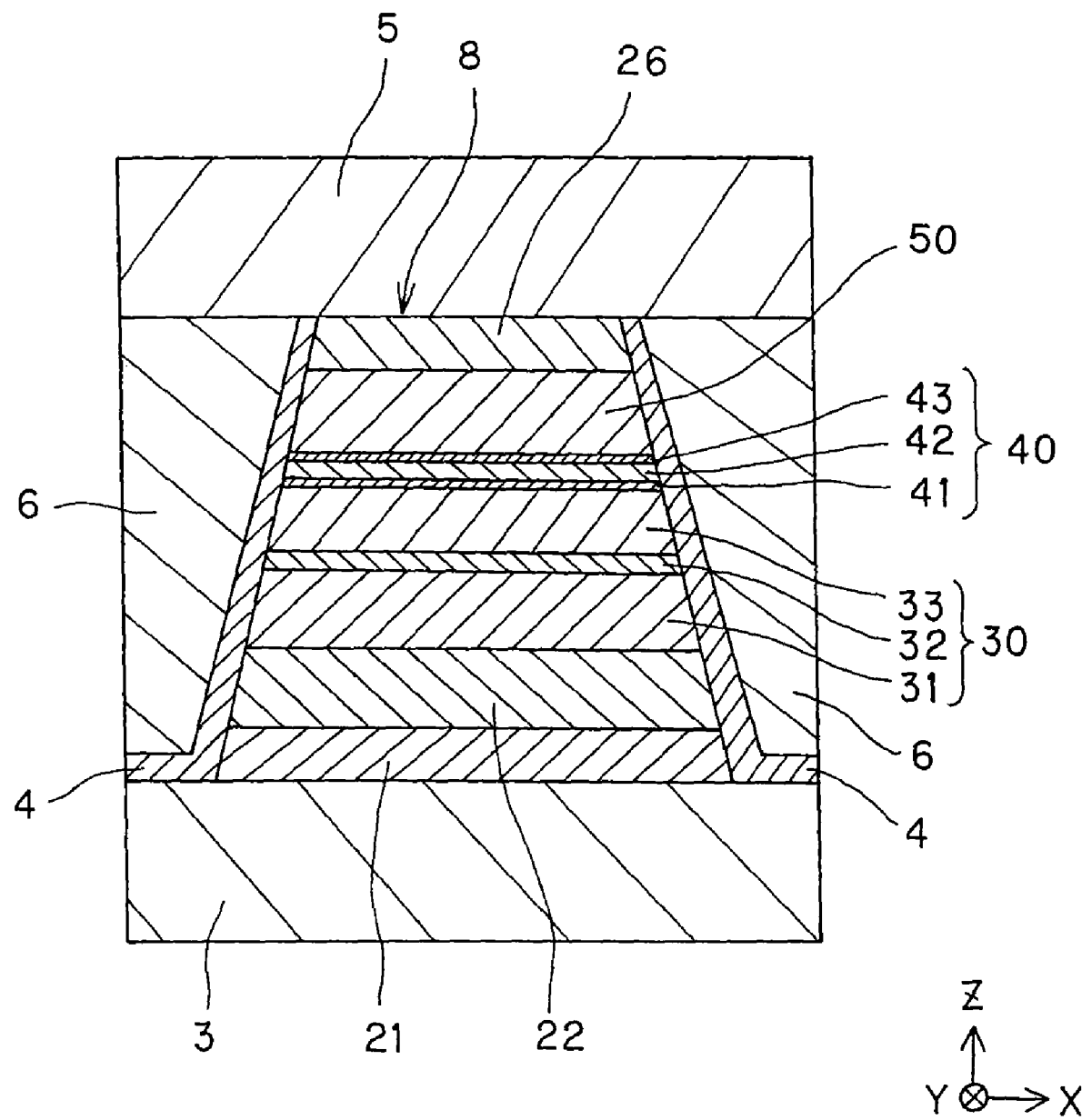
FIG. 1 is a sectional view of one embodiment of the invention, especially its section parallel with the surface of the reproducing head opposite to a medium.

FIG. 1 is illustrative of the ABS (air bearing surface) of a reproducing head in one embodiment of the invention: it is illustrative in schematic of the ABS of the giant magnetoresistive device (CPP-GMR device) of the CPP structure—part of the invention. The ABS is generally corresponding to a plane (hereinafter often called the medium opposite plane) at which a reproducing head is in opposition to a recording medium; however, it is understood that the ABS here includes even a section at a position where the multilayer structure of the device can be clearly observed. For instance, a protective layer of DLC or the like (the protective layer adapted to cover the device), in a strict sense, positioned facing the medium opposite plane may be factored out, if necessary.

Figure 2:
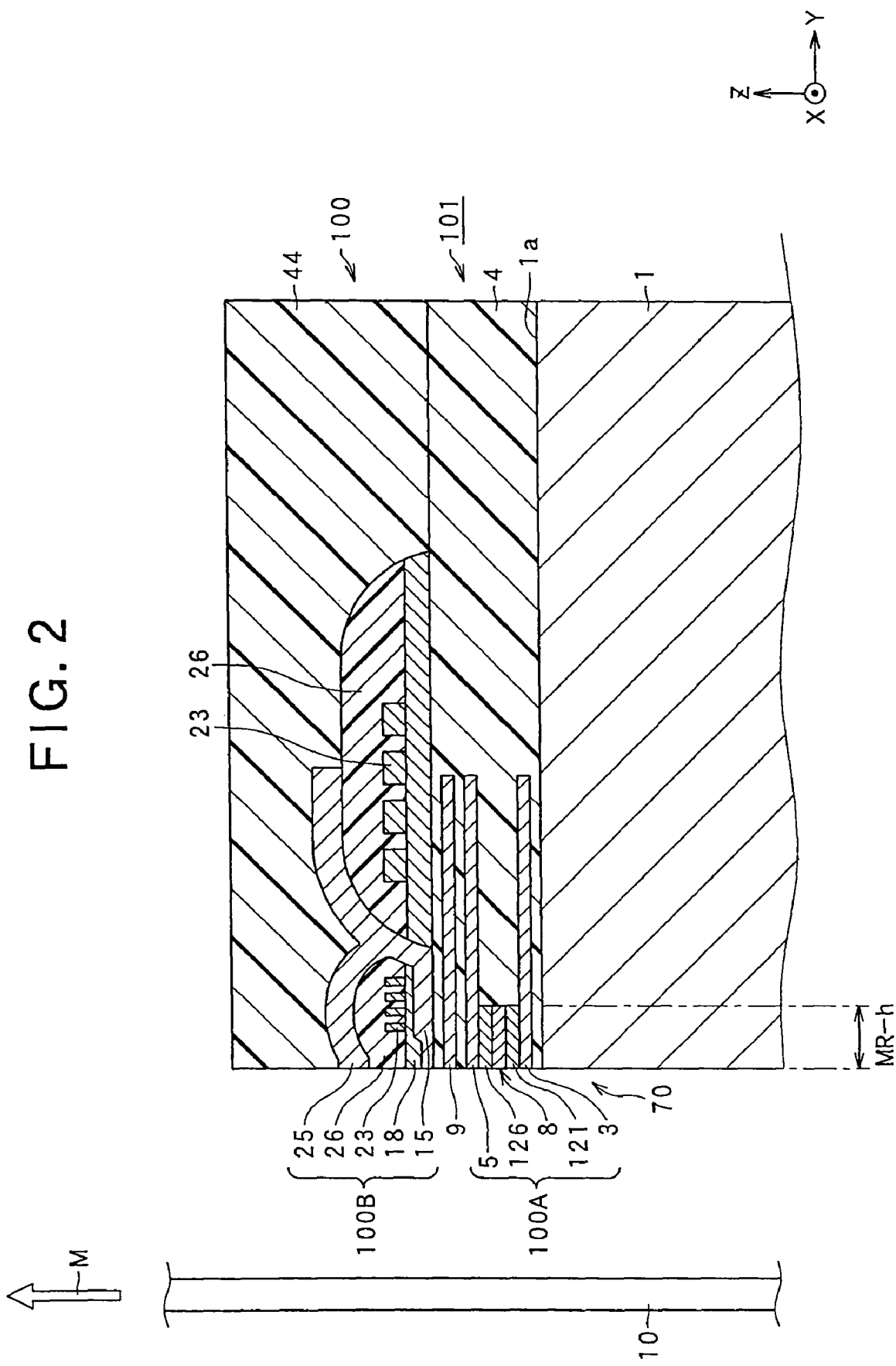
FIG. 2 is illustrative of the construction of the thin-film magnetic head according to one preferable embodiment of the invention: it is a sectional view of the surfaces of the thin-film magnetic head opposite to a medium and vertical to a substrate.

FIG. 2 is illustrative of the construction of the thin-film magnetic head according to one preferable embodiment of the invention: it is illustrative of the ABS of the thin-film magnetic head and a section vertical to the substrate.

Figure 3:
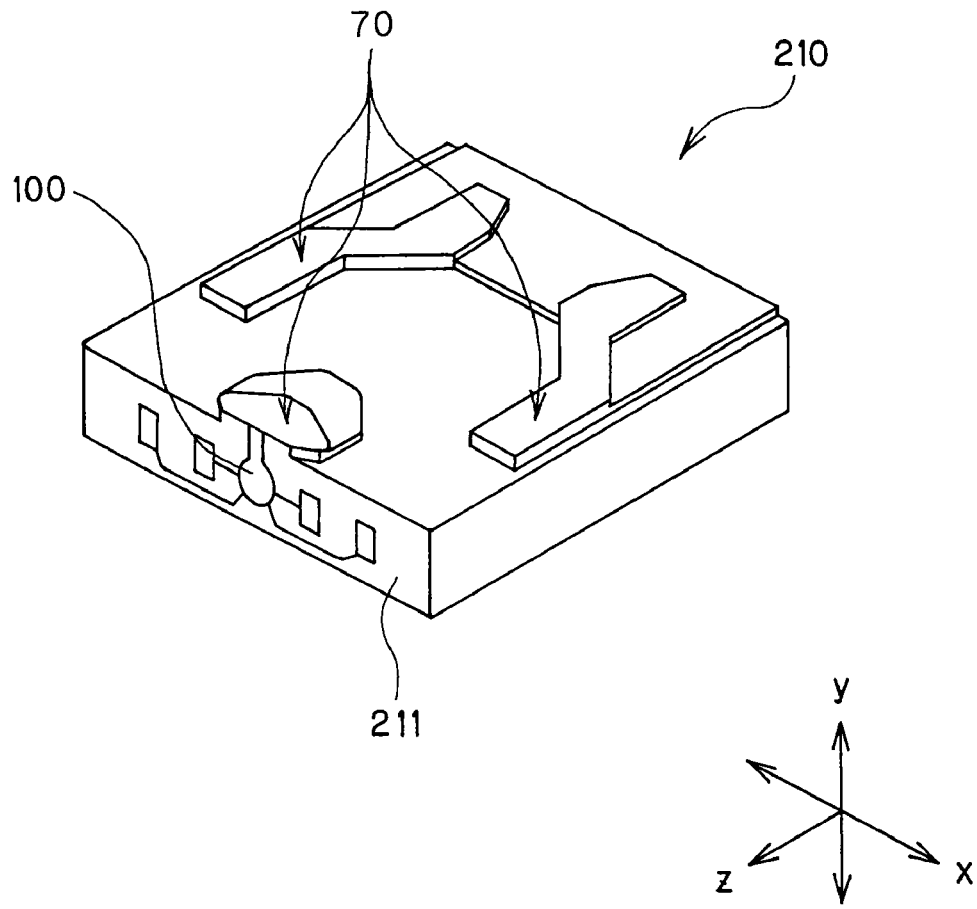
FIG. 3 is illustrative in perspective of the slider included in the head gimbal assembly according to one embodiment of the invention.
Figure 4:
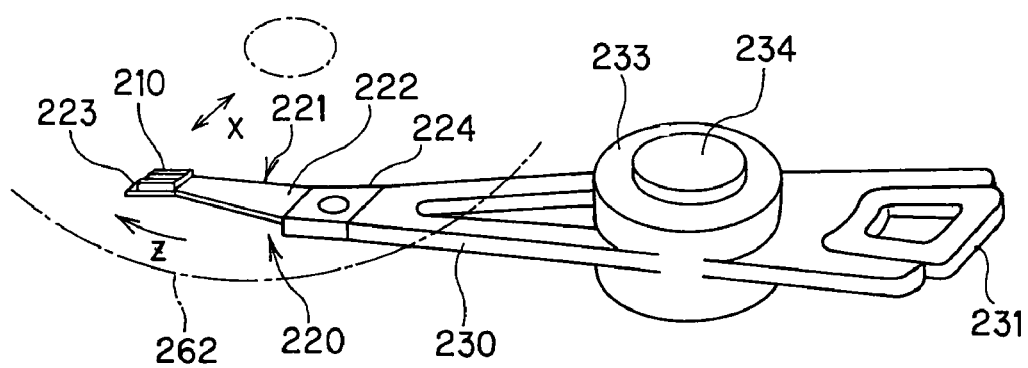
FIG. 4 is illustrative in perspective of the head arm assembly comprising the head gimbal assembly according to one embodiment of the invention.
Figure 5:
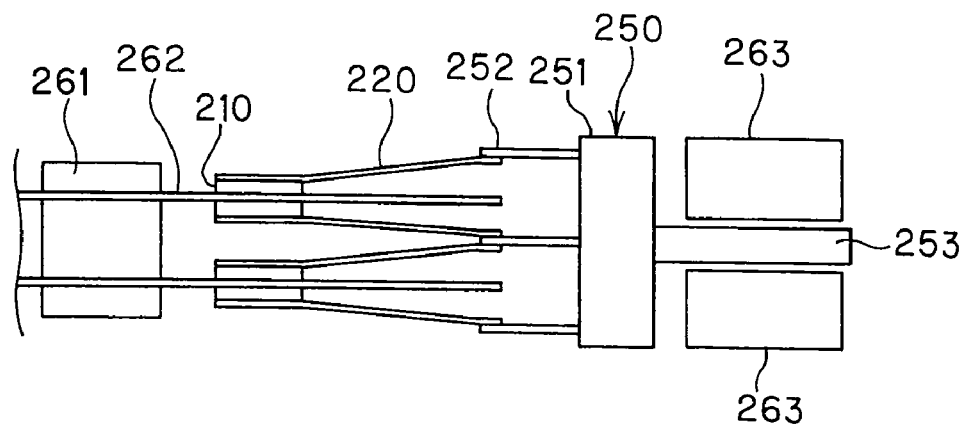
FIG. 5 is illustrative of part of the magnetic disk system according to one embodiment of the invention.
Figure 6:
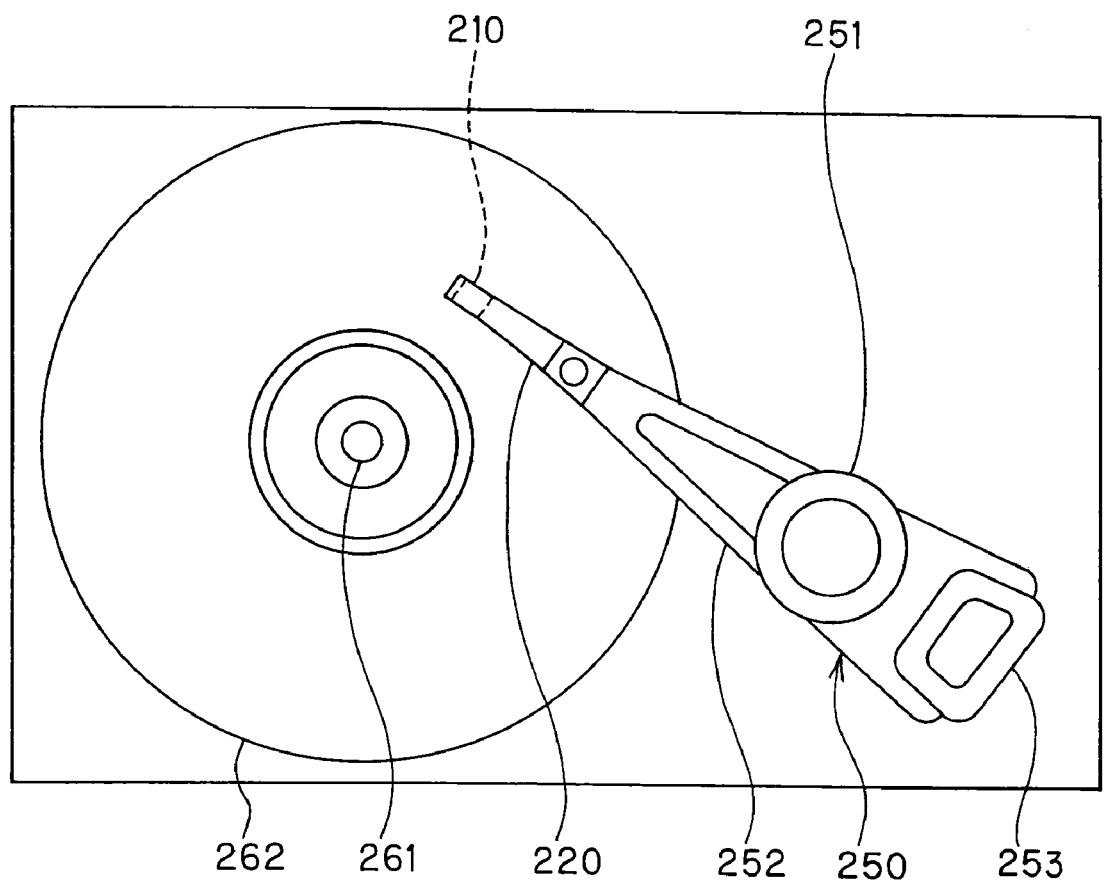
FIG. 6 is a plan view of the magnetic disk system according to one embodiment of the invention.

FIG. 3 is illustrative in perspective of the slider included in the head gimbal assembly according to one embodiment of the invention; FIG. 4 is illustrative in perspective of the head arm assembly comprising the head gimbal assembly according to one embodiment of the invention; FIG. 5 is illustrative of part of the magnetic disk system according to one embodiment of the invention; and FIG. 6 is a plan view of the magnetic disk system according to one embodiment of the invention.

In the following disclosure of the invention, the sizes of each device component in the X-, Y- and Z-axis directions shown in the drawings will be referred to as the "width", "length" and "thickness", respectively. The side of the device nearer to the air bearing surface (the plane of the thin-film magnetic head in opposition to the recording medium) in the Y-axis direction will be called "forward" and the opposite side (depth-wise side) will be called "rearward", and the direction of stacking the individual films up will be called "upward" or "upper side" and the opposite direction will be called "downward" or "lower side".

[Giant Magnetoresistive Device (CPP-GMR Device) of the CPP Structure]

The construction of the reproducing head comprising the inventive giant magnetoresistive device (CPP-GMR device) of the CPP structure is now explained in details with reference to FIG. 1.

As noted above, FIG. 1 is a sectional view corresponding to a section of the reproducing head parallel with the medium opposite plane.

As shown in FIG. 1, the reproducing head according to the embodiment here comprises a first shield layer 3 and a second shield layer 5 that are located at a given space and opposed vertically on the sheet, a giant magnetoresistive device 8 (hereinafter referred to as the GMR device 8) interposed between the first shield layer 3 and the second shield layer 5, an insulating film 4 adapted to cover two sides of the GMR device 8 and a part of the upper surface of the first shield layer 3 along those sides, and two bias magnetic field-applying layers 6 adjacent to two such sides of the GMR device 8 via the insulating layer 4.

In the embodiment here, the first 3 and the second shield layer 5 take a so-called magnetic shield role plus a pair-of-electrodes role. In other words, they have not only a function of shielding magnetism but also function as a pair of electrodes adapted to pass a sense current through the GMR device 8 in a direction intersecting the plane of each of the layers forming the GMR device 8, for instance, in a direction perpendicular to the plane of each of the layers forming the GMR device 8 (stacking direction).

Apart from the first 3 and the second shield layer 5, another pair of electrodes may additionally be provided above and below the GMR device.

The reproducing head in the invention here comprises the GMR device 8 of the CPP structure—part of the invention.

Referring to the inventive GMR device 8 of the CPP structure in terms of a broad, easy-to-understand concept, it comprises a spacer layer 40, and two ferromagnetic layers 30 and 50 stacked and formed with the spacer layer 40 sandwiched between them, as depicted in FIG. 1.

In the embodiment shown in FIG. 1, the ferromagnetic layer 30 positioned below becomes a fixed magnetization layer 30, and the ferromagnetic layer 50 positioned above becomes a free layer 50. And as a sense current is applied in the stacking direction of the GMR device 8, it causes the device to perform its own function: there is the GMR device 8 of the CPP (current perpendicular to plane) structure involved.

The free layer 50 has the direction of magnetization changing in response to an external magnetic field, i.e., a signal magnetic field from the recording medium, and the fixed magnetization layer 30 has the direction of magnetization fixed under the action of an anti-ferromagnetic layer 22. In FIG. 1, there is one embodiment shown in which the antiferromagnetic layer 22 is formed on the bottom side (the side of the first shield layer 3); in one possible modification to it, however, the antiferromagnetic layer 22 may be formed on the top side (the side of the second shield layer 5) so that the free layer 50 and the fixed magnetization layer 30 are interchanged in position.

(Explanation of the Fixed Magnetization Layer 30)

In the invention, the fixed magnetization layer 30 is formed on the antiferromagnetic layer 22 having a pinning action via an underlay layer 21 formed on the first shield layer 3.

In a preferable embodiment of the invention, the fixed magnetization layer 30 has a so-called synthetic pinned layer arrangement comprising, in order from the side of the antiferromagnetic layer 22, an outer layer 31, a nonmagnetic intermediate layer 32 and an inner layer 33, all stacked together in order.

The outer layer 31, and the inner layer 33 is provided by a ferromagnetic layer made of, for instance, a ferromagnetic material containing Co, and Fe. The outer 31 and the inner layer 33 are antiferromagnetically coupled and fixed such that their magnetization directions are opposite to each other.

The outer 31, and the inner layer 33 is preferably made of, for instance, a $Co_{70}Fe_{30}$ (atomic %) alloy. The outer layer has a thickness of preferably about 2 to 7 nm, and the inner layer 33 has a thickness of preferably about 2 to 10 nm. The inner layer 33 may also contain a Heusler alloy layer.

For instance, the nonmagnetic intermediate layer 32 is made of a nonmagnetic material containing at least one selected from the group consisting of Ru, Rh, Ir, Re, Cr, Zr and Cu, and has a thickness of, for instance, about 0.3 to 1.0 nm. The nonmagnetic intermediate layer 32 is provided to fix the magnetization of the inner layer 33 and the magnetization of the outer layer 31 in mutually opposite directions. The phrase "magnetization in mutually opposite directions" stands for a broad concept that encompasses just only two such magnetizations in just opposite directions of 180° but also those in different directions of 180°±20° as well.

(Explanation of the Free Layer 50)

The free layer 50 has its magnetization direction changing depending on an external magnetic field, i.e., a signal magnetic field from the recording medium, and is made of a ferromagnetic layer (soft magnetic layer) having a small coercive force. The free layer 50 has a thickness of, for instance, about 2 to 10 nm, and may be in either a single layer form or a multilayer form including a plurality of ferromagnetic layers. The free layer 50 may also contain a Heusler alloy layer.

On such free layer 50, there is a protective layer 26 formed, which comprises a Ta or Ru layer as an example, as shown in FIG. 1. The protective layer 26 has a thickness of about 0.5 to 20 nm.

(Explanation of the Spacer Layer 40)

In the invention, the spacer layer 40 is made up of a first nonmagnetic metal layer 41 and a second nonmagnetic metal layer 43, and a semiconductor oxide layer 42 interposed between these first and second nonmagnetic metal layers 41 and 43.

More specifically, the spacer layer 40 is made up of a three-layer structure comprising first nonmagnetic metal layer 41/semiconductor oxide layer 42/the second nonmagnetic metal layer 43 stacked together in order. In the embodiment here, the first nonmagnetic metal layer 41 is positioned on the side of the fixed magnetization layer 30, while the second nonmagnetic metal layer 43 is positioned on the side of the free layer 50, as depicted in FIG. 1. These layers are each explained in more details.

Semiconductor Oxide Layer 42

The semiconductor oxide layer 42 forming a part of the spacer layer 40 comprises zinc oxide (ZnO) of wurtzite structure as a main component.

At least one metal element selected from the group consisting of Zn, Ge, V, and Cr is contained as a dopant in the zinc oxide of wurtzite structure (ZnO). Specifically, the aforesaid metal element is contained as the dopant among the lattices of wurtzite structure forming zinc oxide. Among the preferable metal elements (dopants) there are Zn and Ge. The most preferable metal element (dopant) is Zn. The content of such a metal element (dopant) to be contained in the zinc oxide of wurtzite structure is in the range of 0.05 to 0.90 at %, preferably 0.06 to 0.60 at %, and even more preferably 0.07 to 0.40 at %.

As the content of the given metal element here falls short of 0.05 at %, it causes electrical conductivity to drop drastically. It follows that because of markedly increased area resistivity AR, MR changes are heavily dependent of tunnel currents, giving rise to inconvenience that shot noises are likely to occur. There is also a tendency that electrical conductivity does not show any linear change with respect to the amount of an interstitial metal, giving rise to another inconvenience that device characteristics are likely to vary largely.

As the content of the given metal element here is in excess of 0.90 at %, on the other hand, the wurtzite structure of zinc oxide is apt to be out of order, resulting in a tendency that the MR ratio drops drastically due to scattering. This might be a problem inherent in the given metal element used here.

Figure 7:
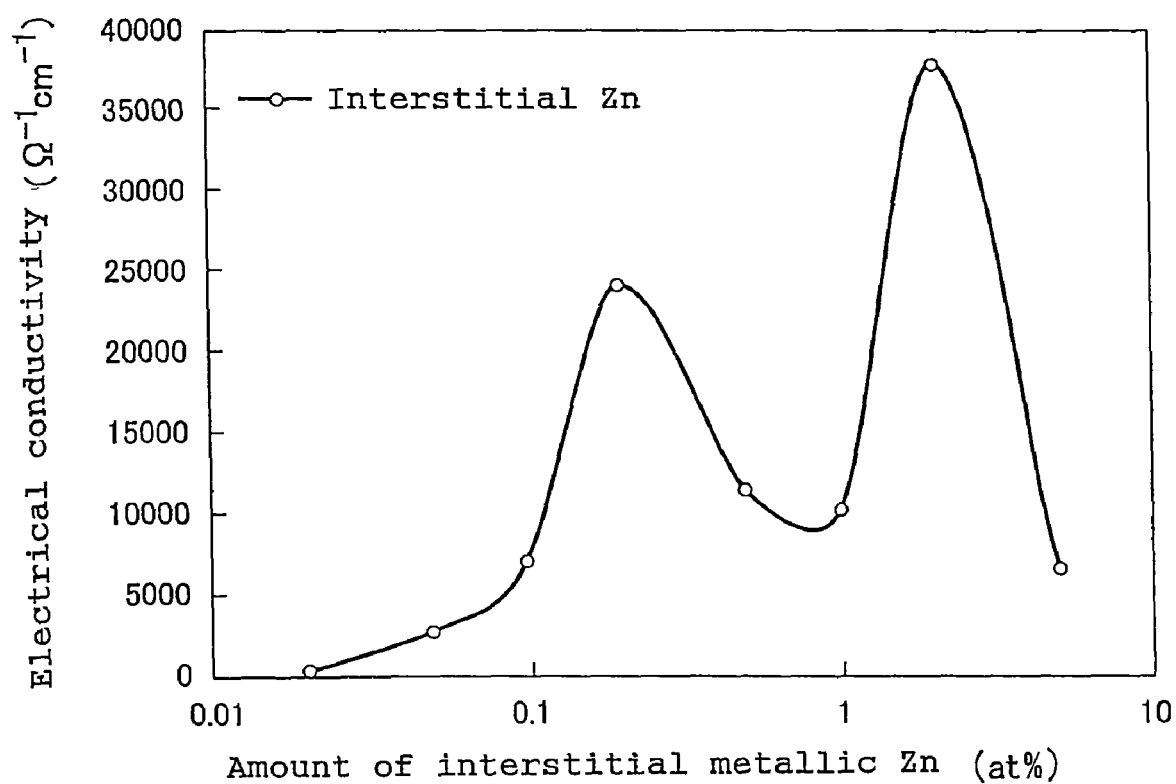
FIG. 7 is a graph indicative of relations between the content of an interstitial metal in relations between the wurtzite structure of zinc oxide and the Zn dopant and electric conductivity.

Especially with the invention, there is a unique phenomenon found in a graph indicative of relations between electrical conductivity and the content of the interstitial metal in relations between the wurtzite structure of zinc oxide and the Zn dopant. That is, as shown in FIG. 7, there are two high electrical conductivity peaks appearing in the graph indicative of the relations between the content of the ZnO interstitial metal and electrical conductivity. Through experimentation, it has been ascertained that by proper use of electrical conductivity peak characteristics in a low concentration side area of 0.05 to 0.9 at % in particular, it is possible to achieve a magnetoresistive device capable of having a low area resistivity AR and extremely high MR ratios. With Ge, V, and Cr, too, there are similar tendencies.

Such semiconductor oxide layer 42 should preferably be formed by the molecular beam epitaxy (MBE) technique that is one of ultra-high vacuum deposition techniques, wherein a flow of molecular beams, i.e., vapors (molecules) in a substantially uniform direction hits upon a substrate for thin-film crystal growth. Because the preparation of a single-crystal film structure occurs in an ultra-high vacuum of the order of $10^{-8}$ Pa, ever-fresh vapors (molecules) arrive at the surface of the substrate, and the number of those molecules is usually determined by the temperature alone of an evaporation source so that the growth rate of crystals, the concentration of impurities, and the composition ratio of a multinary compound can be placed under precise control.

In the invention, the concentration of the metal element contained as the dopant may be adjusted via the rate of evaporation of Zn from the metallic Zn in a Knudsen cell and the amount of oxygen radicals fed. For oxygen radicals, oxygen gas is fed as oxygen element via an RF radical source.

The content of the metal element contained as the dopant in the wurtzite structure of zinc oxide may be determined by finding the concentration of carriers from measurements of hole and Seebeck coefficients.

Such a thin film is usually heat treated at 200 to 350° C. for 1 to 10 hours after film-formation for the purpose of crystallizing the ZnO layer thereby making its resistance low. By the "after film-formation" is meant both after the formation of the semiconductor oxide layer and after the formation of the whole device. Ordinarily, the heat treatment is implemented after the formation of the whole device.

Such semiconductor oxide layer 42 should have a thickness in the range of 1.0 to 2.5 nm, preferably 1.4 to 2.2 nm, and more preferably 1.6 to 2.0 nm. As this value falls short of 1.0 nm, there are large variations of device characteristics such as area resistivity AR likely to occur. As the thickness is in excess of 2.5 nm, on the other hand, there is inconvenience that there is a deviation from the resistance area demanded for the CPP-GMR device.

The First 41, and the Second Nonmagnetic Metal Layer 43

It is preferred that the first nonmagnetic metal layer 41 positioned below in FIG. 1 be made of Cu, and the second nonmagnetic metal layer 43 positioned above be made of Zn. That is, the spacer layer 40 is made up of a three-layer structure comprising Cu/ZnO/Zn from below in FIG. 1.

The first 41, and the second nonmagnetic metal layer 43 should have a thickness of the order of 0.3 to 2.0 nm.

(Explanation of the Antiferromagnetic Layer 22)

The antiferromagnetic layer 22 works such that by way of exchange coupling with the fixed magnetization layer 30 as described above, the magnetization direction of the fixed magnetization layer 30 is fixed.

For instance, the antiferromagnetic layer 22 is made of an antiferromagnetic material containing at least one element M' selected from the group of Pt, Ru, Rh, Pd, Ni, Cu, Ir, Cr and Fe, and Mn. The content of Mn is preferably 35 to 95 at %. The antiferromagnetic material is broken down into two types: (1) a non-heat treatment type antiferromagnetic material that shows antiferromagnetism even in the absence of heat treatment to induce an exchange coupling magnetic field between it and a ferromagnetic material, and (2) a heat treatment type antiferromagnetic material that comes to show antiferromagnetism by heat treatment. Usually, heat treatment is applied to the antiferromagnetic material of the aforesaid type (1), too, so as to put the direction of exchange coupling in order. In the invention, both types (1) and (2) may be used without restriction. For instance, the non-heat treatment type antiferromagnetic material is exemplified by RuRhMn, FeMn, and IrMn, and the heat treatment type antiferromagnetic material is exemplified by PtMn, NiMn, and PtRhMn.

The antiferromagnetic layer 22 has a thickness of about 4 to 30 nm.

It is here noted that for the layer for fixing the magnetization direction of the fixed magnetization layer 30, it is acceptable to use a hard magnetic layer comprising a hard magnetic material such as CoPt in place of the aforesaid antiferromagnetic layer.

The underlay layer 21 formed below the antiferromagnetic layer 22 is provided to improve the crystallization and orientation of each of the layers stacked on it in general, and the exchange coupling of the antiferromagnetic layer 22 and the fixed magnetization layer 30 in particular. For such underlay layer 21, for instance, a multilayer structure of Ta and NiCr layers is used. The underlay layer 21 has a thickness of about 2 to 6 nm as an example.

The area resistivity, AR, of the magnetoresistive device 8 (CPP-GMR device 8) here is in the range of 0.1 to 0.5 $\Omega \cdot \mu m^2$, preferably 0.12 to 0.3 $\Omega \cdot \mu m^2$, and more preferably 0.14 to 0.28 $\Omega \cdot \mu m^2$. Any deviation from the range of 0.1 to 0.3 $\Omega \cdot \mu m^2$ would make it difficult to obtain large MR ratios while reducing noise and holding back the influences of spin torque.

The device (CPP-GMR device) to be measured for its area resistivity is a multilayer arrangement comprising underlay layer 21, antiferromagnetic layer 22, fixed magnetization layer 30, spacer layer 40, free layer 50 and protective layer 26, as shown in FIG. 1.

The insulating layer 4 shown in FIG. 1, for instance, may be made of alumina. The bias magnetic field-applying layer 6, for instance, may be made of a hard magnetic layer (hard magnet) or a multilayer structure of a ferromagnetic layer and an antiferromagnetic layer. Specifically, there is the mention of CoPt or CoCrPt.

With the exception of the semiconductor oxide layer 42, the giant magnetoresistive device of the CPP structure (CPP-GMR device) as described above may be formed using vacuum film-formation processes such as sputtering. If necessary, after-heat treatment may be applied to it.

It is here noted that the invention may be applied to any magnetoresistive device wherein the state of two magnetic layers functioning as sensors changes relatively in response to an external magnetic filed. In other words, the invention is in no sense limited to the type and structure of the device that has been explained so far in details. For instance, the invention in general, and the structure of the spacer layer 40 in particular may be applied as well to a magnetoresistive device having as a basic structure a simple three-layer structure of ferromagnetic layer/nonmagnetic intermediate layer/ferromagnetic layer, as disclosed typically in U.S. Pat. No. 7,019,371B2 or U.S. Pat. No. 7,035,062B1.

[Explanation of the Whole Structure of the Thin-Film Magnetic Head]

FIG. 2 is illustrative in section (section in the Y-Z plane) of a thin-film magnetic head parallel with the so-called air bearing surface (ABS).

A thin-film magnetic head 100 shown in FIG. 2 is used on a magnetic recording system such as a hard disk drive for the purpose of applying magnetic processing to a recording medium 10 like a hard disk moving in a medium travel direction M.

The thin-film magnetic head 100 illustrated in the drawing is a composite type head capable of implementing both recording and reproducing as magnetic processing. The structure comprises, as shown in FIG. 2, a slider substrate 1 made of a ceramic material such as AlTiC ($Al_2O_3 \cdot TiC$), and a magnetic head unit 101 formed on the slider substrate 1.

The magnetic head unit 101 has a multilayer structure comprising a reproducing head portion 100A adapted to implement reproducing processing of magnetic information recorded by making use of the magneto-resistive (MR) effect and, for instance, a shield type recording head portion 100B adapted to implement a perpendicular recording type processing.

A detailed account is now given below.

A first shield layer 3 and a second shield layer 5 are each a planar layer formed in such a way as to be almost parallel with the side 1a of the slider substrate 1, forming a part of the ABS that is a medium opposite plane 70.

A magnetoresistive device 8 is disposed in such a way as to be held between the first 3 and the second shield layer 5, forming a part of the medium opposite plane 70. And a height in the perpendicular direction (Y-direction) to the medium opposite plane 70 defines an MR height (MR-h).

For instance, the first 3 and the second shield layer 5 are each formed by pattern plating inclusive of frame plating or the like.

The magnetoresistive device 8 is a multilayer film formed in such a way as to be almost parallel with the side 1a of the slider substrate 1, forming a part of the medium opposite plane 70.

The magnetoresistive device 8 is a multilayer film of the current-perpendicular-to-plane type (CPP type) with a sense current passing in the direction perpendicular to the stacking plane.

As also shown in FIG. 2, between the second shield layer 5 and the recording head portion 100B there is an inter-device shield layer 9 formed that is made of a similar material as the second shield layer 5 is.

The inter-device shield layer 9 keeps the magneto-resistive device 8 functioning as a sensor out of a magnetic field occurring from the recording head portion 100B, taking a role in prevention of extraneous noises upon reading. Between the inter-device shield layer 9 and the recording head portion 100B there may also be a backing coil portion formed. The backing coil portion is to generate a magnetic flux that cancels out a magnetic flux loop that is generated from the recording head portion 100B, passing through the upper and lower electrode layers of the magnetoresistive device 8: this backing coil portion works to hold back the wide adjacent track erasure (WATE) phenomenon that is unwanted writing or erasure operation with the magnetic disk.

At a gap between the first and second shield layers 3 and 5 on the side of the magnetoresistive device 8 that faces away from the medium opposite plane 70, at the rear of the first and second shield layers 3, 5 and the inter-shield shield layer 9 that face away from the medium opposite plane 70, at a gap between the first shield layer 3 and the slider substrate 1, and at a gap between the inter-device shield layer 9 and the recording head portion 100B, there are insulating layers 4 and 44 formed, one each made of alumina or the like.

The recording head portion 100B is preferably constructed for the purpose of perpendicular magnetic recording, and comprises a main magnetic pole layer 15, a gap layer 18, a coil insulating layer 26, a coil layer 23 and an auxiliary magnetic pole layer 25, as shown in FIG. 2. It goes without saying that the recording head portion may be changed from the perpendicular recording mode to the so-called longitudinal recording mode.

The main magnetic pole layer 15 is set up as a magnetic guide path for guiding a magnetic flux induced by the coil layer 23 to the recording layer of the magnetic recording medium 10 with information being to be written on it while converging that magnetic flux. At the end of the main magnetic pole layer 15 here that is on the medium opposite plane 70 side, the width in the track width direction (along the X-axis of FIG. 2) and the thickness in the stacking direction (along the Z-axis of FIG. 2) of the main magnetic pole layer 15 should preferably be less than those of the rest. Consequently, it is possible to generate a fine yet strong writing magnetic flux well fit for high recording densities.

The end on the medium opposite plane 70 side of the auxiliary magnetic pole layer 25 magnetically coupled to the main magnetic pole layer 15 forms a trailing shield portion having a layer section wider than that of the rest of the auxiliary magnetic pole layer 25. As shown in FIG. 2, the auxiliary magnetic pole layer 25 is opposed to the end of the main magnetic pole layer 15 on the medium opposite plane 70 side while the gap layer 18 made of an insulating material such as alumina and the coil insulating layer 26 are interposed between them.

By the provision of such auxiliary magnetic pole layer 25, it is possible to make steeper a magnetic field gradient between the auxiliary magnetic pole layer 25 and the main magnetic pole layer 15 near the medium opposite plane 70. Consequently, jitters of signal outputs diminish, resulting in the ability to minimize error rates upon reading.

The auxiliary magnetic pole layer 25, for instance, is formed at a thickness of, e.g., about 0.5 to 5 μm using frame plating, sputtering or the like. The material used may be an alloy comprising two or three of, for instance, Ni, Fe and Co, or comprising them as a main component with the addition of given elements to it.

The gap layer 18 is formed in such a way as to space the coil layer 23 away from the main magnetic pole layer 15. The gap layer 18 is constructed from $Al_2O_3$, DLC (diamond-like carbon) or the like having a thickness of, for instance, about 0.01 to 0.5 μm, and formed using, for instance, sputtering, CVD or the like.

[Explanation of the Head Gimbal Assembly and the Hard Disk System]

One each example of the head gimbal assembly and the hard disk system, used with the foregoing thin-film head mounted on it, is now explained.

A slider 210 included in the head gimbal assembly is first explained with reference to FIG. 3. In the hard disk system, the slider 210 is located in such a way as to face a hard disk that is a rotationally driven disk-form recording medium. This slider 210 primarily comprises a substrate 211 built up of a substrate and an overcoat.

The substrate 211 is in a generally hexahedral shape. Of the six surfaces of the substrate 211, one surface is in opposition to the hard disk. On that one surface there is a medium opposite plane 30 formed.

As the hard disk rotates in the z-direction in FIG. 3, it causes an air flow passing between the hard disk and the slider 210 to induce lift relative to the slider 210 in the downward y-direction in FIG. 3. This lift in turn causes the slider 210 to levitate over the surface of the hard disk. Note here that the x direction in FIG. 3 traverses tracks on the hard disk.

Near the end of the slider 210 on an air exit side (the left lower end in FIG. 3), there is a thin-film magnetic head formed according to the embodiment here.

A head gimbal assembly 220 according to this embodiment is now explained with reference to FIG. 4. The head gimbal assembly 220 comprises a slider 210 and a suspension 221 adapted to resiliently support that slider 210. The suspension 221 comprises a leaf spring-form load beam 222 made of typically stainless steel, a flexure 223 attached to one end of the load beam 222 and having the slider 210 joined to it for giving a suitable degree of flexibility to the slider 210, and a base plate 224 attached to the other end of the load beam 222.

The base plate 224 is adapted to be attached to an arm 230 of an actuator for moving the slider 210 in the track traverse direction x of the hard disk 262. The actuator comprises the arm 230 and a voice coil motor for driving that arm 230. At a portion of the flexure 223 having the slider 210 attached to it, there is a gimbal portion provided for keeping the posture of the slider 210 constant.

The head gimbal assembly 220 is attached to the arm 230 of the actuator. The head gimbal assembly 220 attached to one arm 230 is called a head arm assembly, whereas the head gimbal assembly 220 attached to a carriage at its plurality of arms is referred to as a head stack assembly.

FIG. 4 illustrates one example of the head arm assembly, wherein the head gimbal assembly 220 is attached to one end of the arm 230. To the other end of the arm 230, a coil 231 forming a part of the voice coil motor is attached. Halfway across the arm 230, there is a bearing portion 233 attached to a shaft 234 adapted to support the arm 230 in a pivotal fashion.

One each example of the head stack assembly and the hard disk system according to the embodiment here is now explained with reference to FIGS. 5 and 6.

FIG. 5 is illustrative of part of the hard disk system, and FIG. 6 is a plan view of the hard disk system.

A head stack assembly 250 comprises a carriage 251 having a plurality of arms 252. The plurality of arms 252 are provided with a plurality of the head gimbal assemblies 220 such that they line up perpendicularly at an interval. On the side of the carriage 251 that faces away from the arms 252, there is a coil 253 attached, which coil becomes a part of the voice coil motor. The head stack assembly 250 is incorporated in the hard disk system.

The hard disk system comprises a plurality of hard disks 262 attached to a spindle motor 261. For each hard disk 262, two sliders 210 are located such that they are opposite to each other with the hard disk 262 held between them. The voice coil motor has also permanent magnets 263 located at opposite positions with the coil 253 of the head stack assembly 250 held between them.

The head stack assembly 250 except the slider 210 and the actuator correspond to the positioning device here which is operable to support the slider 210 and position it relative to the hard disk 262.

With the hard disk system here, the actuator is actuated to move the slider 210 in the track traverse direction of the hard disk 262, thereby positioning the slider 210 with respect to the hard disk 262. The thin-film magnetic head incorporated in the slider 210 works such that information is recorded by a recording head in the hard disk 262, and the information recorded in the hard disk 262 is played back by a reproducing head.

The head gimbal assembly and the hard disk system here have pretty much the same action as the thin-film magnetic head according to the foregoing embodiments.

While the embodiment here has been described with reference to the thin-film magnetic head of the structure wherein the reproducing head portion is located on the substrate side and the perpendicular recording head portion is stacked on the reproducing head, it is contemplated that that order of stacking could be reversed. When the thin-film magnetic head here is used as a read-only head, the recording head could be removed from it.

EXAMPLES

The invention of the aforesaid CPP-GMR device is now explained in further details with reference to some specific examples.

Experimental Example I

The inventive CPP-GMR device sample comprising such multilayer structure as set out in Table 1, given below, was prepared and readied up for experimentation.

For sample preparation, the following film-formation process was used.

That is, the semiconductor oxide layer 42 in the spacer layer 40 was formed by the MBE technique. Other films were basically prepared by sputtering.

Note here that in the preparation of specific samples, the (1) type and (2) content of the additive metal element (Me) to be contained in the semiconductor oxide layer (composed mainly of ZnO) forming a part of the spacer layer in Table 1 were varied to prepare such samples as set out in Table 2.

Two additive metal elements (Me): Zn and Ge were used.

For sample preparation, the respective layers forming the CPP-GMR device, each in a film form, were successively formed and stacked into a multilayer structure, which was then heat treated at 250° C. for three hours. The heat treatment was implemented for the purpose of putting in order the direction of exchange coupling between the antiferromagnetic layer and the ferromagnetic layer and crystallizing the semiconductor oxide layer to make its resistance low.

From experimentation, it has already been confirmed that the heat treatment should preferably be carried out in the temperature range of 200 to 350° C. so as to make sure the CPP-GMR device keeps good characteristics.

The semiconductor oxide layers: ZnO (comparative with no dopant added) and (ZnO+dopant metal Me), forming a part of the spacer layer, were formed as follows.

(i) Semiconductor Oxide Layer Composed Only of ZnO as Shown in the Reference (Undoped Comparative) Example The ZnO layer was formed by the MBE technique.

The respective layers forming the device, each in a film form, were formed, and then heat treated at 250° C. for three hours to crystallize the ZnO layer thereby making its resistance low.

The multilayer film structure forming such a basic portion of the device was processed into a columnar form, which was protected on its sides with an insulator, thereby preparing the CPP-GMR device.

(ii) Semiconductor Oxide Layer Provided in the Form of (ZnO+Me)

The MBE technique was used. Evaporation sources for Zn and the dopant metal Me were placed in separate Knudsen cells so that the amount of evaporation was controlled thereby controlling the doping amount.

In the dopant added state shown in Table 2, just the given % of the metal element was contained in the formed film.

The respective layers forming the device, each in a film form, were formed, and then heat treated at 250° C. for three hours so that the (ZnO+Me) layer was crystallized to make its resistance low.

The multilayer film structure forming such a basic portion of the device was processed into a columnar form, which was protected on its sides with an insulator, thereby preparing the CPP-GMR device.

Each CPP-GMR device sample prepared as mentioned above was in a square form of 0.2 μm in width and 0.2 μm in length, as viewed from above.

Each CPP-GMR device sample was measured for (1) MR ratio and (2) area resistivity AR ($\Omega \cdot \mu m^2$) of device in the following way.

(1) MR Ratio

The MR ratio was measured by an ordinary dc four-terminal method. The MR ratio is a value obtained by dividing the amount of change of resistance ΔR by the resistance value R, and expressed in terms of ΔR/R. The MR ratio here is calculated as %.

Note here that the MR ratio is an average of 100 device samples.

(2) Area Resistivity AR ($\Omega \cdot \mu m^2$) of Device

The dc four-terminal method was used.

The results of estimation are set out in Table 2, given later.

TABLE 1

| Multilayer Structure | | Layer Material | Thickness (nm) |
|---|---|---|---|
| | Protective Layer | Ru | 3.0 |
| | Free Layer | Co70Fe30 | 2.5 |
| Spacer Layer | 2$^{nd}$ Nonmagnetic Metal Layer | Zn | 0.4 |
| | Semiconductor Oxide Layer | (ZnO + Me) | 1.7 |
| | 1$^{st}$ Nonmagnetic Metal Layer | Cu | 0.8 |
| Fixed Magnetization Layer | Inner Layer | Co70Fe30 | 2.5 |
| | Nonmagnetic Intermediate Layer | Ru | 0.8 |
| | Outer Layer | Co70Fe30 | 2.5 |
| | Antiferromagnetic Layer | IrMn | 5.0 |
| | Underlay Layer | (Ta/Ru) | (1.0/2.0) |

TABLE 2

| | ZnO Semiconductor Oxide Layer | | | |
|---|---|---|---|---|
| Sample No. | Type of Additive Metal | Content of Additive Metal (at %) | MR ratio (%) | Area Resistivity of device AR ($\Omega \cdot \mu m^2$) |
| I-0 | Zn | 0 | 90 | 3.0 |
| I-1 | Zn | 0.01 | 70 | 2.1 |
| I-2 | Zn | 0.05 | 44 | 0.5 |
| I-3 | Zn | 0.1 | 39 | 0.27 |
| I-4 | Zn | 0.2 | 32 | 0.17 |
| I-5 | Zn | 0.3 | 28 | 0.18 |
| I-6 | Zn | 0.4 | 26 | 0.22 |
| I-7 | Zn | 0.5 | 24 | 0.24 |
| I-8 | Zn | 0.6 | 23 | 0.25 |
| I-9 | Zn | 0.7 | 22 | 0.26 |
| I-10 | Zn | 0.8 | 21 | 0.27 |
| I-11 | Zn | 0.9 | 21 | 0.28 |
| I-12 | Zn | 1.0 | 20 | 0.29 |
| I-13 | Zn | 2.0 | 15 | 0.29 |
| II-0 | Ge | 0 | 90 | 3.0 |
| II-1 | Ge | 0.01 | 68 | 2.0 |
| II-2 | Ge | 0.05 | 40 | 0.7 |
| II-3 | Ge | 0.1 | 35 | 0.3 |
| II-4 | Ge | 0.2 | 30 | 0.28 |
| II-5 | Ge | 0.3 | 26 | 0.27 |
| II-6 | Ge | 0.4 | 22 | 0.26 |
| II-7 | Ge | 0.5 | 20 | 0.26 |
| II-8 | Ge | 0.6 | 19 | 0.26 |
| II-9 | Ge | 0.7 | 18 | 0.26 |
| II-10 | Ge | 0.8 | 17 | 0.25 |
| II-11 | Ge | 0.9 | 17 | 0.25 |
| II-12 | Ge | 1.0 | 16 | 0.25 |
| II-13 | Ge | 2.0 | 13 | 0.40 |

From the results of Table 2, the advantages of the invention would be undisputed. It has been found that the use of V and Cr instead of Zn and Ge gives substantially similar results, too.

That is, ever higher MR ratios can be obtained while holding back an increase in the area resistivity (AR) by using zinc oxide as the main component of the semiconductor oxide layer forming a part of the spacer layer, and allowing that main component zinc oxide to contain at least one selected from the group consisting of Zn, Ge, V and Cr in an amount of, e.g., 0.05 to 0.9 metal at %.

The target value the MR ratio here is 16% or greater, and the target value of the area resistivity of device, AR ($\Omega \cdot \mu m^2$), is 0.1 to 0.5 $\Omega \cdot \mu m^2$.

Experimental Example II

In the above Experimental Example I, the thickness T1 of the semiconductor oxide layer 42 in Sample I-5 (with Zn added in an amount of 0.3 at %), and Sample II-5 (with Ge added in an amount of 0.3 at %) was variously varied as in Table 3, given below, thereby preparing samples.

Following the above Experimental Example I, these samples were each measured for (1) MR ratio and (2) area resistivity of device, AR ($\Omega \cdot \mu m^2$).

The results are set out in Table 3.

TABLE 3

| | ZnO Semiconductor Oxide Layer | | | Area Resistivity |
|---|---|---|---|---|
| Sample No. | Type of Additive Metal | Thickness T1 (nm) | MR ratio (%) | of Device AR ($\Omega \cdot \mu m^2$) |
| I-20 | Zn | 0.8 | 6 | 0.06 |
| I-21 | Zn | 1.0 | 16 | 0.09 |
| I-22 | Zn | 1.2 | 22 | 0.12 |
| I-5 | Zn | 1.7 | 28 | 0.18 |
| I-23 | Zn | 2.0 | 29 | 0.24 |
| I-24 | Zn | 2.2 | 27 | 0.51 |
| I-25 | Zn | 2.5 | 25 | 0.90 |
| I-26 | Zn | 3.0 | 23 | 3.0 |
| I-27 | Zn | 3.5 | 21 | 3.9 |
| II-20 | Ge | 0.8 | 5 | 0.07 |
| II-21 | Ge | 1.0 | 16 | 0.10 |
| II-22 | Ge | 1.2 | 21 | 0.13 |
| II-5 | Ge | 1.7 | 26 | 0.27 |
| II-23 | Ge | 2.0 | 27 | 0.31 |
| II-24 | Ge | 2.2 | 26 | 0.59 |
| II-25 | Ge | 2.5 | 24 | 1.0 |
| II-26 | Ge | 3.0 | 22 | 3.1 |
| II-27 | Ge | 3.5 | 20 | 4.2 |

From the results of Table 3, it has been found that with the ZnO semiconductor oxide layer based on the Zn metal element-containing system, preferable results are obtained when its thickness T1 is in the range of 1.0 to 2.5 nm, esp., 1.2 to 2.0 nm.

It has also been found that with the ZnO semiconductor oxide layer based on the Ge metal element-containing system, preferable results are obtained when its thickness T1 is in the range of 1.0 to 2.5 nm, esp., 1.2 to 2.0 nm.

From the above results of experimentation, the advantages of the invention would be undisputed.

That is, the semiconductor oxide layer that forms a part of the spacer layer in the inventive giant magneto-resistive device (CPP-GMR device) is composed of zinc oxide of wurtzite structure that is doped with a dopant given by at least one metal element selected from the group consisting of Zn, Ge, V, and Cr in a content of 0.05 to 0.90 at %: there is the advantage obtained that ever higher MR ratios are achievable while holding back an increase in the area resistivity AR ($\Omega \cdot \mu m^2$).

INDUSTRIAL APPLICABILITY

The present invention could be applied to the industry of magnetic disk systems comprising a magneto-resistive device operable to read the magnetic field intensity of magnetic recording media or the like as signals.

What we claim is:

1. A giant magnetoresistive device (CPP-GMR device) of a CPP (current perpendicular to plane) structure, comprising a spacer layer, and two ferromagnetic layers stacked together and formed while said spacer layer is sandwiched between them, with a sense current applied in the stacking direction, wherein:

said two ferromagnetic layers function such that an angle made between directions of mutual magnetizations changes relatively in response to an external magnetic field, said spacer layer comprises first and second nonmagnetic metal layers, one each formed of a nonmagnetic metal material, and a semiconductor oxide layer interposed between the first and second nonmagnetic metal layers, and said semiconductor oxide layer forming a part of said spacer layer is zinc oxide of wurtzite structure, and said zinc oxide is doped with a dopant comprising at least one metal element selected from the group consisting of zinc or Zn, germanium or Ge, vanadium or V, and chromium or Cr in a content of 0.05 to 0.90 at %.

2. The magnetoresistive device according to claim 1, wherein the metal element with which said zinc oxide is doped is Zn.

3. The magnetoresistive device according to claim 1, wherein said first nonmagnetic metal layer comprises copper or Cu, and said second nonmagnetic metal layer substantially comprises Zn.

4. The magnetoresistive device according to claim 1, wherein the semiconductor oxide layer forming a part of said spacer layer has a thickness of 1.0 to 2.5 nm.

5. The magnetoresistive device according to claim 1, wherein said first and second nonmagnetic metal layers each have a thickness of 0.3 to 2.0 nm.

6. The magnetoresistive device according to claim 1, wherein said two ferromagnetic layers are constructed, one as a fixed magnetization layer having a fixed direction of magnetization, and another as a free layer functioning such that the direction of magnetization changes in response to an external magnetic field.

7. The magnetoresistive device according to claim 6, wherein said spacer layer is located such that said first nonmagnetic metal layer is in contact with said fixed magnetization layer, and said second nonmagnetic metal layer is in contact with said free layer.

8. The magnetoresistive device according to claim 1, wherein said two ferromagnetic layers are free layers that operate such that a relative angle between the magnetizations of both layers changes in response to an external magnetic field.

9. The magnetoresistive device according to claim 1, wherein the semiconductor oxide layer forming a part of said spacer layer comprises zinc oxide of wurtzite structure that is doped with Zn that acts as the dopant in a content of 0.05 to 0.90 at %, and the magnetoresistive device has an area resistivity of 0.1 to 0.5 $\Omega \cdot \mu m^2$.

10. A thin-film magnetic head, characterized by comprising:

a plane in opposition to a recording medium, a magnetoresistive device as recited in claim 1, which is located near said medium opposite plane to detect a signal magnetic field from said recording medium, and a pair of electrodes for passing a current in the stacking direction of said magnetoresistive device.

11. A head gimbal assembly, characterized by comprising:

a slider including a thin-film magnetic head as recited in claim 10 and located in such a way as to oppose to a recording medium, and a suspension adapted to resiliently support said slider.

12. A magnetic disk system, characterized by comprising:

a slider including a thin-film magnetic head as recited in claim 10 and located in such a way as to oppose to a recording medium, and a positioning device adapted to support and position said slider with respect to said recording medium.

* * * * *